United States Patent
Atsumi et al.

(10) Patent No.: US 9,511,394 B2
(45) Date of Patent: Dec. 6, 2016

(54) CLEANING APPARATUS

(71) Applicant: Olympus Corporation, Tokyo (JP)

(72) Inventors: Motohiro Atsumi, Tokyo (JP);
Masahiro Akahane, Kamiina-gun (JP)

(73) Assignee: Olympus Corporation, Hachioji-shi, Tokyo (JP)

( * ) Notice: Subject to any disclaimer, the term of this patent is extended or adjusted under 35 U.S.C. 154(b) by 314 days.

(21) Appl. No.: 14/098,963

(22) Filed: Dec. 6, 2013

(65) Prior Publication Data

US 2014/0090673 A1 Apr. 3, 2014

Related U.S. Application Data

(63) Continuation of application No. PCT/JP2012/072034, filed on Aug. 30, 2012.

(30) Foreign Application Priority Data

Sep. 9, 2011 (JP) ................................. 2011-196851

(51) Int. Cl.
*B08B 3/02* (2006.01)
*B05B 13/04* (2006.01)
(Continued)

(52) U.S. Cl.
CPC ............. *B08B 3/02* (2013.01); *B05B 13/0442* (2013.01); *B05B 15/0431* (2013.01);
(Continued)

(58) Field of Classification Search
CPC . B08B 3/02; G02B 27/0006; B05B 13/0442; B05B 15/0431; B05B 7/2489; B05B 9/0403; H01L 21/67051; G02C 13/006
See application file for complete search history.

(56) References Cited

U.S. PATENT DOCUMENTS 3,953,265 A * 4/1976 Hood .................. H01L 21/6708
156/345.16
7,644,512 B1 * 1/2010 Liu ..................... C11D 11/0041
118/65
(Continued)

FOREIGN PATENT DOCUMENTS

JP S62-160691 10/1987
JP 64-76724 A 3/1989
(Continued)

OTHER PUBLICATIONS

Machine Translation of JP 2010050226 to Kikuchi, Mar. 2010.*
(Continued)

*Primary Examiner* — Michael Barr
*Assistant Examiner* — Benjamin L Osterhout
(74) *Attorney, Agent, or Firm* — Arent Fox LLP

(57) ABSTRACT

This cleaning apparatus includes a rotation holding unit that holds and rotates an object; a cleaning fluid spray unit that sprays a cleaning fluid onto a spot-like cleaning region on the object, which is held by the rotation holding unit; a cleaning region moving unit that moves at least one of the rotation holding unit and the cleaning fluid spray unit to relatively move the cleaning region from the rotation center of the object toward the outer peripheral side thereof; a layered air current forming unit that forms a layered air current entering the surface of the object so as to cover the periphery of the cleaning region from a backward side in the direction of movement of the cleaning region relative to the rotation center; and a layered air current moving unit that relatively moves the incoming position of the layered air current while following the relative movement of the cleaning region.

15 Claims, 8 Drawing Sheets

(51) Int. Cl.
  *B05B 15/04* (2006.01)
  *H01L 21/67* (2006.01)
  *G02B 27/00* (2006.01)
  *G02C 13/00* (2006.01)
  *B05B 7/24* (2006.01)
  *B05B 9/04* (2006.01)

(52) U.S. Cl.
  CPC ....... *G02B 27/0006* (2013.01); *G02C 13/006* (2013.01); *H01L 21/67051* (2013.01); *B05B 7/2489* (2013.01); *B05B 9/0403* (2013.01)

(56) References Cited

U.S. PATENT DOCUMENTS

| | | | | |
|---|---|---|---|---|
| 2002/0029788 | A1* | 3/2002 | Verhaverbeke | B08B 3/02 134/1.3 |
| 2003/0084925 | A1* | 5/2003 | Nakajima | B01F 3/04007 134/26 |
| 2003/0170988 | A1* | 9/2003 | Izumi | B05B 7/066 438/689 |
| 2005/0115671 | A1* | 6/2005 | Araki | B08B 7/04 156/345.12 |
| 2006/0249182 | A1* | 11/2006 | Hayamizu | H01L 21/67051 134/34 |
| 2008/0016714 | A1* | 1/2008 | Kaneyama | H01L 21/67225 34/317 |

FOREIGN PATENT DOCUMENTS

| | | |
|---|---|---|
| JP | H02246115 A | 10/1990 |
| JP | 06-208948 A | 7/1994 |
| JP | 2003-019467 A | 1/2003 |
| JP | 2003-300023 A | 10/2003 |
| JP | 2004363453 A | 12/2004 |
| JP | 2010-050226 A | 3/2010 |

OTHER PUBLICATIONS

Machine Translation of JP 06028948 to Sakai et al., Jul. 1994.*
International Search Report issued for PCT/JP2012/072034, mailing date Nov. 6, 2012.
Japanese Office Action mailed Jul. 28, 2015 issued for corresponding Application No. JP 2011-196851.

* cited by examiner

CLEANING APPARATUS

This application is a continuation application based on PCT/JP2012/072034, filed on Aug. 30, 2012, claiming priority based on Japanese Patent Application No. 2011-196851, filed in Japan on Sep. 9, 2011. The contents of both the Japanese Patent Application and the PCT Application are incorporated herein by reference.

TECHNICAL FIELD

The present invention relates to a cleaning apparatus.

BACKGROUND ART

In the related art, in cleaning apparatuses that remove, for example, particulates or the like from the surface of an object, a configuration, of which the jet cleaning pressurizes a cleaning fluid and sprays it onto the object and the two-fluid jet cleaning mixes the cleaning fluid in a gas current and sprays the cleaning fluid with onto the object together with the gas current, is known.

For example, Japanese Unexamined Patent Application, First Publication No. S64-76724 describes a high-pressure jet cleaning apparatus suitable for manufacturing processes of semiconductors, electronic components, or the like, as an example of such cleaning apparatuses. This high-pressure jet cleaning apparatus performs cleaning by spraying spot-like high-pressure water onto an object placed horizontally from vertically above and moving a jet nozzle for the high-pressure water radially outward from the center of the object while rotating the object.

If a cleaning fluid, such as the high-pressure water, is sprayed onto the object in this way, particulates and impurities adhering to the object may be scattered and may reattach to the cleaned surface of the article.

For this reason, Japanese Unexamined Patent Application, First Publication No. 2003-300023 describes a cleaning apparatus that includes a nozzle that blows a cleaning fluid, to which high pressure is applied against the upper surface of an object, a receiving unit that is provided on at least one of the upstream side and downstream side of the object in a transport direction to accumulate the cleaning fluid, and a vacuum nozzle that sucks the cleaning fluid accumulated in the receiving unit and that transports the object in the horizontal direction for every single sheet.

In this cleaning apparatus, particles on the object are removed by blowing the cleaning fluid onto the object. After the particles are removed, reattachment of the particles are prevented by accumulating, sucking, and eliminating the cleaning fluid including the particles after this removal in the receiving unit.

Solution to Problem

According to a first aspect of the present invention, a cleaning apparatus includes a rotation holding unit which holds and rotates an object which is to be cleaned; a cleaning fluid spray unit which sprays a cleaning fluid onto a spot-like cleaning region on the object held by the rotation holding unit; a cleaning region moving unit which moves at least one of the rotation holding unit and the cleaning fluid spray unit to relatively move the cleaning region from a rotation center of the object toward an outer peripheral side thereof; a layered air current forming unit which forms a layered air current entering a surface of the object so as to cover a periphery of the cleaning region from a backward side in a relative movement direction of the cleaning region relative to the rotation center; and a layered air current moving unit which relatively moves an incoming position of the layered air current while following the relative movement of the cleaning region.

According to a second aspect of the present invention, in the first aspect, the cleaning apparatus may further include a holding unit which integrally holds the cleaning fluid spray unit and the layered air current forming unit and a moving unit which moves at least one of the holding unit and the rotation holding unit. An elevating unit that supports the holding unit and elevates the holding unit along a vertical axis of the holding unit is configured by the cleaning region moving unit, the layered air current moving unit, and the moving unit.

According to a third aspect of the present invention, in the first or second aspect, in the cleaning apparatus, a central axis of a spray port of the cleaning fluid spray unit may be inclined to a side opposite to the relative movement direction of the cleaning region with respect to a normal line of the surface of the object at the center position of the cleaning region.

According to a fourth aspect of the present invention, in the third aspect, in the cleaning apparatus, the spraying direction of the layered air current may be inclined to the side opposite to the relative movement direction of the cleaning region with respect to the normal line of the surface of the object at the center position of the cleaning region and may be inclined with respect to the central axis of the spray port of the cleaning fluid spray unit.

According to a fifth aspect of the present invention, in any one of the first to fourth aspects, the cleaning apparatus further may include a tilt holding unit and a tilt control unit. The tilt holding unit may tiltably hold the cleaning fluid spray unit. The tilt control unit may control a tilt amount of the tilt holding unit so that an angle of the central axis of the spray port of the cleaning fluid spray unit with respect to the normal line of the surface of the object at the center position of the cleaning region becomes a constant angle.

According to a sixth aspect of the present invention, in any one of the first aspect to fifth aspect, in the cleaning apparatus, the rotation holding unit may hold the object so that an axis of the rotation center inclines from the vertical axis. The object may be an optical element. The relative movement direction of the cleaning region may be set to a direction along a vertical plane including the optical axis of the optical element.

DESCRIPTION OF EMBODIMENTS

Figure 1A:
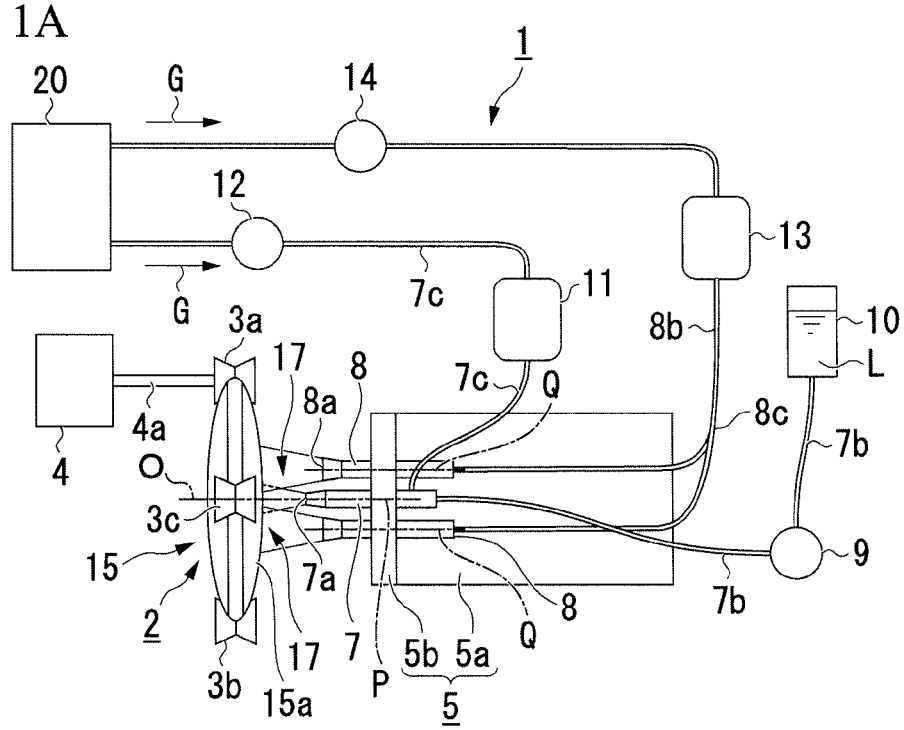
FIG. 1A is a typical plan view showing the schematic configuration of a cleaning apparatus of a first embodiment of the present invention.

Hereinafter, embodiments of the present invention will be described with reference to the accompanying drawings. In all the drawings, even in the case of different embodiments, the same reference numerals will be given to the same or equivalent members, and common description will be omitted.

First Embodiment

A cleaning apparatus of the first embodiment of the present invention will be described.

Figure 1B:
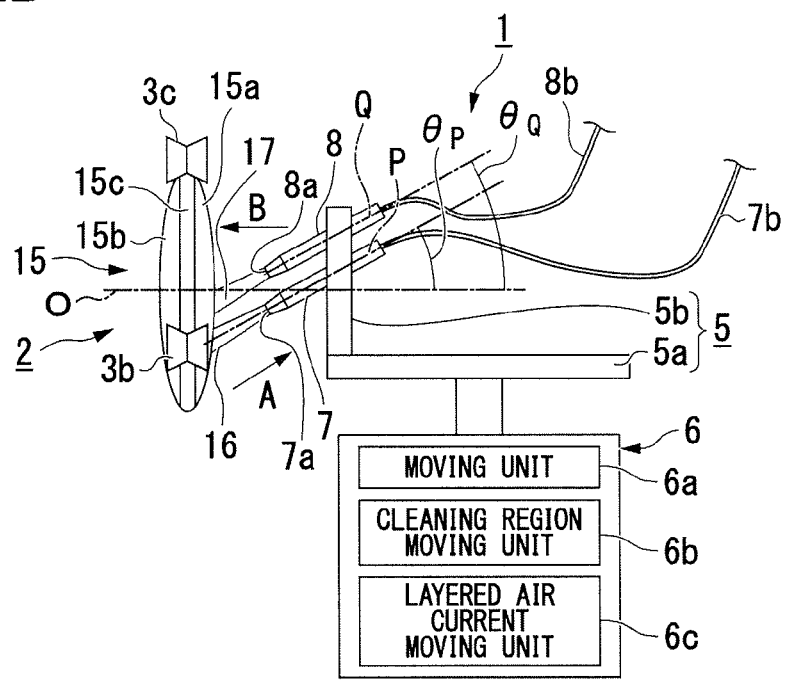
FIG. 1B is a typical front view showing the schematic configuration of the cleaning apparatus of the first embodiment of the present invention.
Figure 2A:
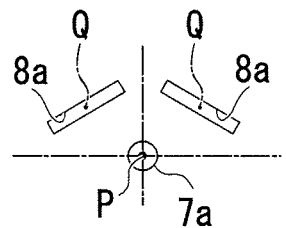
FIG. 2A is a view as seen from A in FIG. 1B.
Figure 2B:
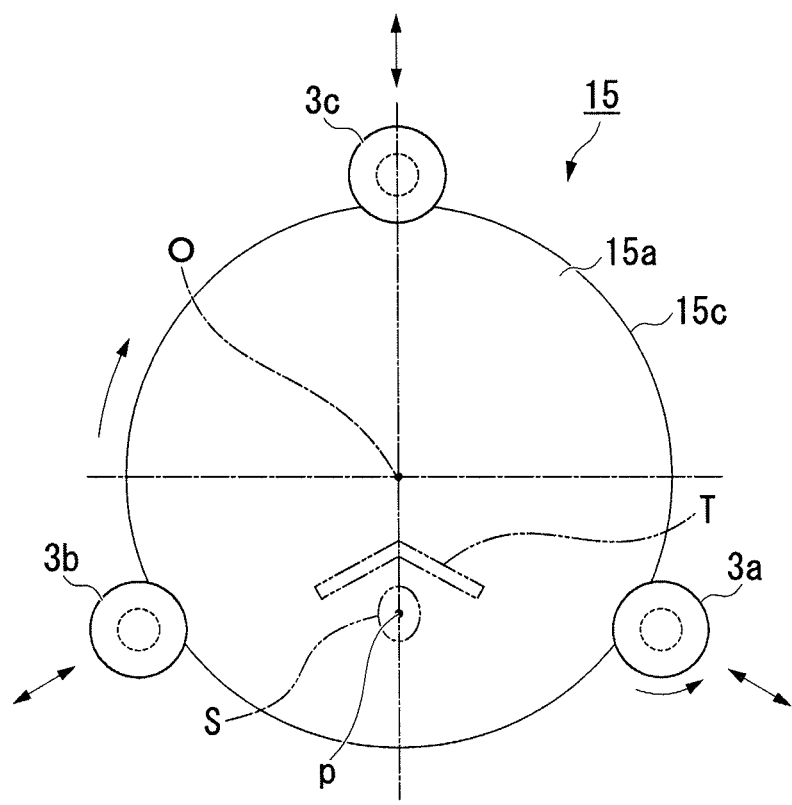
FIG. 2B is a view as seen from B in FIG. 1B.

FIG. 1A is a typical plan view showing the schematic configuration of the cleaning apparatus of the first embodiment of the present invention. FIG. 1B is a typical front view showing the schematic configuration of the cleaning apparatus of the first embodiment of the present invention. FIG. 2A is a view as seen from A in FIG. 1B. FIG. 2B is a view as seen from B in FIG. 1B.

The cleaning apparatus 1 of the first embodiment is an apparatus that sprays a cleaning fluid to an object so as to clean the surface of the object. The cleaning method may be a jet cleaning method of pressurizing and spraying only a cleaning fluid or a two-fluid jet cleaning method of mixing a cleaning fluid in a gas current to spray the cleaning fluid together with the gas current.

In the following, a case where the two-fluid jet cleaning method is adopted will be described as an example.

Additionally, the object is not particularly limited if the article has a shape capable of being rotated in a held state and capable of being cleaned by the two-fluid jet cleaning method.

In the following, as shown in FIGS. 1A and 1B, a case where the object is a glass lens 15 will be described as an example.

A lens 15 is a biconvex lens that has convex lens surfaces 15a and 15b. A lens side surface 15c is formed as a cylindrical surface that is coaxial with an optical axis O.

The surface shape of the convex lens surfaces 15a and 15b may be a spherical surface, or convex surfaces other than the spherical surface, such as an axisymmetrical aspheric surface and an adjustable surface. Additionally, the surface to be cleaned may be any of the convex lens surfaces 15a and 15b. In the following, a case where the convex lens surface 15a is the surface to be cleaned will be described as an example.

The schematic configuration of the cleaning apparatus 1, as shown in FIGS. 1A and 1B, includes a rotation holding unit 2, a fixing stand 5 (holding unit), an elevating stage 6 (a moving unit 6a, a cleaning region moving unit 6b, a layered air current moving unit 6c), a cleaning fluid spray unit 7, and a compressed air spray unit 8 (layered air current forming unit).

In addition, although not particularly shown, the cleaning apparatus includes a control unit that controls the operation of the rotation holding unit 2, the elevating stage 6, or the like.

The rotation holding unit 2 is a member that holds and rotates the lens 15.

The schematic configuration of the rotation holding unit 2 includes a driving roller 3a, holding rollers 3b and 3c, and a motor 4. The driving roller 3a and the holding rollers 3b and 3c press and hold an outer periphery of the lens 15 radially inward, and are provided so as to be rotatable with respect to a supporting member (not shown). The motor 4 rotates the driving roller 3a to thereby transmit a rotational driving force to the lens 15.

The driving roller 3a and the holding rollers 3b and 3c have concave roller surfaces constricted at the centers thereof, respectively by forming cross-sections including rotation center axes thereof in a V-shape or in a U-shape. The driving roller 3a and the holding rollers 3b and 3c are arranged along one vertical plane in a state where the respective rotation center axes thereof are parallel to each other along one horizontal direction.

Accordingly, the roller surfaces of the driving roller 3a and the holding rollers 3b and 3c hold the lens 15 in a state where the driving roller 3a and the holding rollers 3b and 3c abut against a corner portion formed between the convex lens surface 15a and the lens side surface 15c and a corner portion formed between the convex lens surface 15b and the lens side surface 15c. The driving roller 3a and the holding rollers 3b and 3c are configured so as to be capable of rotating around the rotation center axes of the respective rollers.

Additionally, the driving roller 3a and the holding rollers 3b and 3c, as shown in view 2B, are arranged on a circumference that substantially equally divides the outer periphery of the lens 15 into three.

In the present embodiment, the driving roller 3a and the holding roller 3b are arranged apart from each other in the horizontal direction to hold the lens 15 from below. The holding roller 3c holds the lens 15 from above at an intermediate position between the driving roller 3a and the holding roller 3b.

In such a holding state, the holding central axes of the driving roller 3a and the holding rollers 3b and 3c and the optical axis O are aligned with each other. The optical axis O is a central axis of the lens side surface 15c of the lens 15.

Additionally, the driving roller 3a and the holding rollers 3b and 3c are fixed to the supporting member via a moving arm (not shown) capable of being advanced and retracted (not shown) with respect to the holding central axes. For this reason, the driving roller 3a and the holding rollers 3b and 3c can change the radial positions thereof with respect to the holding central axes in accordance with the size of the external diameter of the lens 15.

Additionally, positional adjustment of the holding roller 3c is possible independently from the driving roller 3a and the holding roller 3b. For this reason, the lens 15 is configured so as to be attachable and detachable from above the driving roller 3a and the holding roller 3b by retracting the holding roller 3c upward.

A rotating shaft of the driving roller 3a is connected to a rotating shaft 4a of the motor 4, and is configured so as to be capable of rotating while interlocking with the rotation of the motor 4. Although a case where the rotating shaft of the driving roller 3a is directly connected to the rotating shaft 4a is shown as an example in FIG. 1A, the connection may be made by interposing, for example, a gear transmission mechanism, a belt transmission mechanism, or the like.

The holding rollers 3b and 3c are configured so as to be capable of rotating while interlocking with the lens 15 rotated by the driving roller 3a.

Although the rotational direction of the motor 4 is not particularly limited, a case where the motor rotates counterclockwise as shown in FIG. 2B will be described below as an example. In this case, as shown in FIG. 2B, the lens 15 rotates clockwise.

From such a configuration, the rotation holding unit 2 is capable of rotatably holding the lens 15 with the optical axis O as a center in a state where the optical axis O is horizontally arranged.

The fixing stand 5 is a holding unit that fixes and integrally holds the cleaning fluid spray unit 7 and the compressed air spray unit 8. The fixing stand 5 includes a plate-shaped base 5a that is horizontally arranged, and a fixing plate 5b that is erected from an end portion of the base 5a.

The fixing plate 5b is arranged at a position where the fixing plate faces the convex lens surface 15a that is a surface to be cleaned of the lens 15 held by the rotation holding unit 2.

The elevating stage 6 is a member that supports the base 5a of the fixing stand 5 from below, and elevates and moves the fixing stand 5 along the vertical axis during cleaning.

As the configuration of the elevating stage 6, for example, a single-axis stage using a motor and a feed-screw mechanism, a linear motor, or the like can be adopted.

The cleaning fluid spray unit 7 is a member that sprays the cleaning fluid L to the surface to be cleaned of the lens 15 held by the rotation holding unit 2. The cleaning fluid spray unit 7 is configured by a tubular member that has a spray port 7a having a circular opening used to form a spray current 16 including the cleaning fluid L formed at a tip portion thereof.

As the cleaning fluid L, for example, pure water, a water-based cleaning fluid, a solvent, or the like can be adopted according to the kind of the object or the dirt. Moreover, a combination may be adopted, in which two kinds, the water-based cleaning fluid and the pure water, are used and cleaning is performed with the pure water after cleaning is performed with the water-based cleaning fluid.

For example, it is preferable for the cleaning fluid L to adopt pure water in the case of glass optical elements, such as the lens 15. When the pure water is used as the cleaning fluid L, this is preferable because management of a waste fluid becomes unnecessary.

Additionally, as shown in FIG. 1B, the cleaning fluid spray unit 7 is fixed to the fixing plate 5b in a posture where, within a vertical plane including the optical axis O, the spray port 7a is directed downward and the central axis P of the cleaning fluid spray unit 7 is inclined by an angle $\theta_P$ with respect to the optical axis O.

As will be described below, when the central axis P is moved with respect to the convex lens surface 15a by lowering the elevating stage 6, it is preferable to set the angle $\theta_P$ so that the incoming angle of the central axis P in the convex lens surface 15a falls within a range of 5° to 60°.

Here, the incoming angle of the central axis P is defined by an angle formed between an extension line of the central axis P and a normal line N (refer to FIG. 3A) of the convex lens surface 15a at an incoming position where the extension line of the central axis P and the convex lens surface 15a intersect each other.

In the present embodiment, as an example, the incoming angle is set to $\theta_P=30(°)$. For example, when the convex lens surface 15a is a spherical surface with a radius of 100 mm and the lens diameter of the lens 15 is 60 mm, changes in the incoming angle of the central axis P are 30° to 47.45° in the setting of $\theta_P=30(°)$.

A supply tube 7b that supplies the cleaning fluid L is connected to a base end portion of the cleaning fluid spray unit 7. Additionally, a supply tube 7c that supplies compressed air G is connected to a side surface of the cleaning fluid spray unit 7 between the connection position of the supply tube 7b and the spray port 7a.

The supply tube 7b is connected to a cleaning fluid supply unit 10 where the cleaning fluid L is stored.

A pump 9 that delivers the cleaning fluid L of the cleaning fluid supply unit 10 to the cleaning fluid spray unit 7 is provided between the cleaning fluid spray unit 7 and the cleaning fluid supply unit 10 in the supply tube 7b.

A supply tube 7c is connected to a compressed air supply source 20 that forms the compressed air G.

A regulator 12 that adjusts the pressure of the compressed air G, and a filter 11 that purifies the compressed air G are provided in this order from the compressed air supply source 20 side between the cleaning fluid spray unit 7 and the compressed air supply source 20 in the supply tube 7c.

In the present embodiment, the spray current 16 is obtained as the cleaning fluid L is turned into mist and is sprayed from the spray port 7a together with the compressed air G. The spray current 16 is formed by supplying the compressed air G from the supply tube 7c while supplying the cleaning fluid L from the supply tube 7b and mixing the compressed air G with the cleaning fluid L within the cleaning fluid spray unit 7.

The emission range of the spray current 16 varies depending on conditions, such as the nozzle shape of the spray port 7a, the flow rate of the cleaning fluid L, or the pressure of the compressed air G. In the present embodiment, these conditions are appropriately set whereby the spray current 16 is emitted while its diameter is slightly increased with the central axis P of the cleaning fluid spray unit 7 as a center. In the present embodiment, as shown in FIG. 2B, the spray current 16 is blown in the shape of a smaller spot compared to the size of the convex lens surface 15a (refer to a two-dot chain line shown by symbol S) on the convex lens surface 15a.

Since the region S against which the spray current 16 is blown is a region where surface cleaning proceeds efficiently due to the pressure or shock produced by blowing the spray current 16, the region is hereinafter referred to as a cleaning region S.

From such a configuration, the cleaning fluid spray unit 7 sprays the cleaning fluid L to the spot-like cleaning region S on the lens 15 held by the rotation holding unit 2.

In the present embodiment, the shape of the spray port 7a is a circular shape with a diameter of 2 mm. Additionally, the cleaning region S at a position where the spray current 16 is blown on the surface top of the convex lens surface 15a becomes larger than a circular shape with a diameter of 2 mm, and is a substantially elliptical vertically-long region.

The position of the cleaning region S can be changed by the elevating stage 6 by relatively moving the cleaning fluid spray unit 7 and the rotation holding unit 2.

In the following, when the position of the cleaning region S on the convex lens surface 15a is expressed, an intersection point between the central axis P and the convex lens surface 15a is used. This intersection point is referred to as a cleaning position p. The cleaning position p substantially coincides with the center of the cleaning region S.

The compressed air spray unit 8 is a member that forms a layered air current 17 that enters the convex lens surface 15a so as to cover the periphery of the cleaning region S from above.

In the present embodiment, the compressed air spray unit 8 is configured by a pair of tubular members at tip portions of which spray ports 8a having a slit-shaped opening through which the compressed air G is sprayed in layers are formed.

As shown in FIG. 2B, both of the compressed air spray units 8 are fixed to the fixing plate 5b in a posture where, within the vertical plane including the optical axis O, the spray ports 8a are directed downward, and central axes Q of the compressed air spray units 8 is inclined by an angle $\theta_Q$ with respect to the optical axis O.

The angle $\theta_Q$ is set to a size equal to or more than the angle $\theta_P$. In the present embodiment, as an example, the incoming angle is set to $\theta_Q=30(°)$.

Additionally, as shown in FIG. 2A, the pair of compressed air spray units 8 are arranged so that the respective spray ports 8a form an inverted V-shape as a whole above the right and left of the spray port 7a of the cleaning fluid spray unit 7, and upper portions of the inverted V-shape are slightly spaced apart from each other in the horizontal direction. That is, the respective spray ports 8a is arranged to form a substantially inverted V-shape.

Additionally, the respective spray ports 8a are arranged at plane-symmetrical positions with the vertical plane including the central axis P as a plane of symmetry.

Since it is considered that layered air currents 17 sprayed from the spray ports 8a spread in the longitudinal direction of the openings of the spray ports 8a, the respective spray ports 8a are arranged in a substantially inverted V-shape, and upper portions of the substantially inverted V-shape are spaced apart from each other in the horizontal direction.

The respective layered air currents 17 spread in the longitudinal direction of the spray ports 8a after being sprayed from the spray ports 8a, whereby the respective layered air currents 17 approach each other as getting close to the convex lens surface 15a, and the inverted V-shaped layered air currents 17 whose upper portions are closed are formed.

The layered air current 17 connected in an inverted V-shape enters the convex lens surface 15a, and as shown in view 2B, is blown against an inverted V-shaped region of the convex lens surface 15a. In the following, a region against which this layered air current 17 is blown is referred to as a blowing region T.

As the spacing between the cleaning region S and the blowing region T is narrower, a region where scattered matter D to be described below is capable of reattaching can be narrowed, which is more preferable. As a specific numerical range, for example, a range of 0 mm to 10 mm is suitable.

Figure 3A:
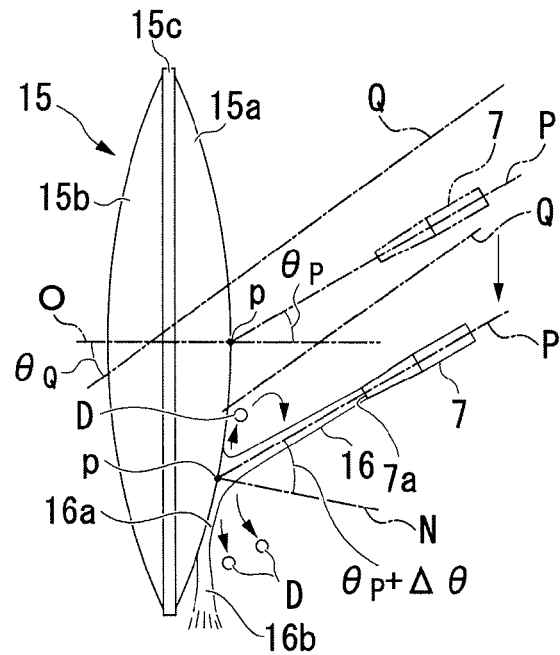
FIG. 3A is an explanatory view, as seen from the front, of the operation of the cleaning apparatus of the first embodiment of the present invention.
Figure 3B:
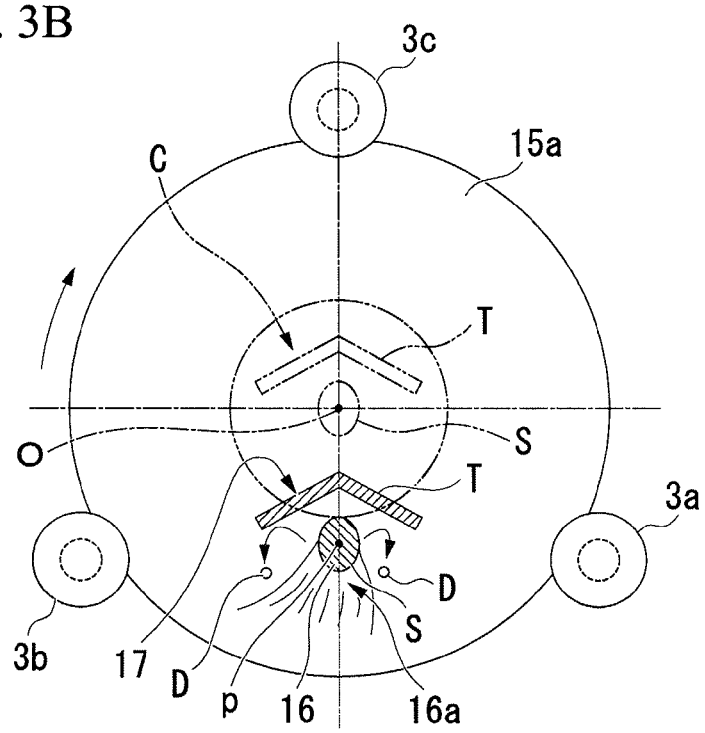
FIG. 3B is a typical explanatory view showing a state on a surface to be cleaned in the cleaning apparatus of the first embodiment of the present invention.

Additionally, a left side (that is, a rotational direction side of the lens 15) in FIG. 3B of the blowing region T is longer compared to a right side (that is, a side opposite to the rotational direction of the lens 15) in FIG. 3B. This is preferable because the region where the scattered matter D is capable of reattaching can be narrowed.

As shown in FIG. 1A, a supply tube 8b that supplies the compressed air G is connected to base end portions of the respective compressed air spray units 8.

The supply tube 8b is provided so as to form a Y-shape as a whole. Tip portions of the supply tube 8b that is double-branched are connected to the respective compressed air spray units 8. Additionally, the base end portion of the supply tube 8b that is unified is connected to the compressed air supply source 20.

A regulator 14 that adjusts the pressure of the compressed air G, and a filter 13 that purifies the compressed air G are provided in this order from the compressed air supply source 20 side between a branching portion 8c in the supply tube 8b and the compressed air supply source 20.

Next, the operation of the cleaning apparatus 1 will be described with a central focus on a cleaning method using the cleaning apparatus 1.

Figure 4A:
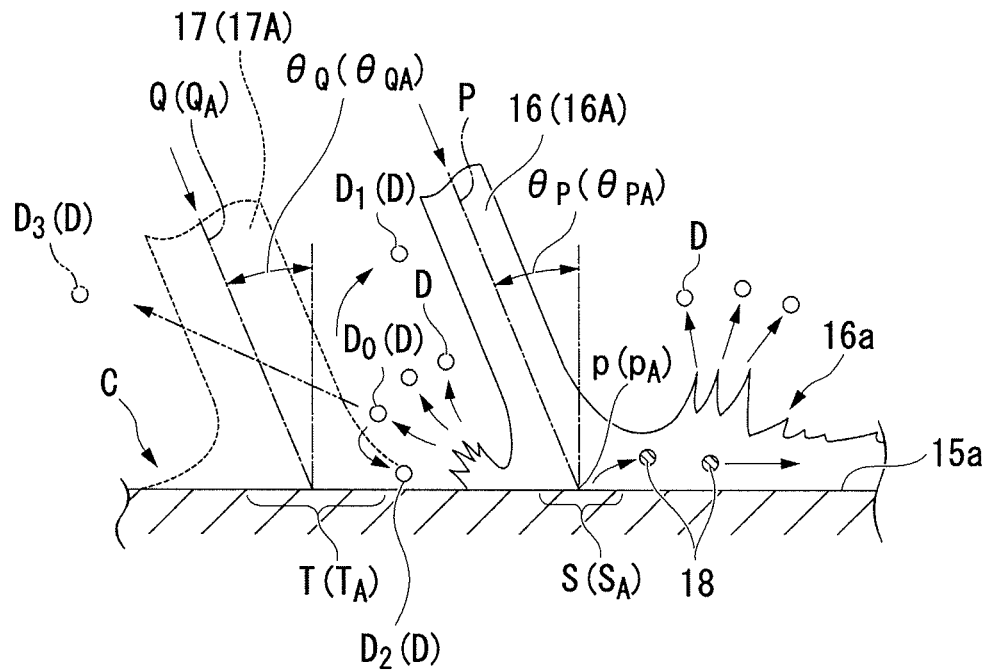
FIG. 4A is a typical view illustrating functions in the cleaning apparatus of the first embodiment of the present invention.
Figure 4B:
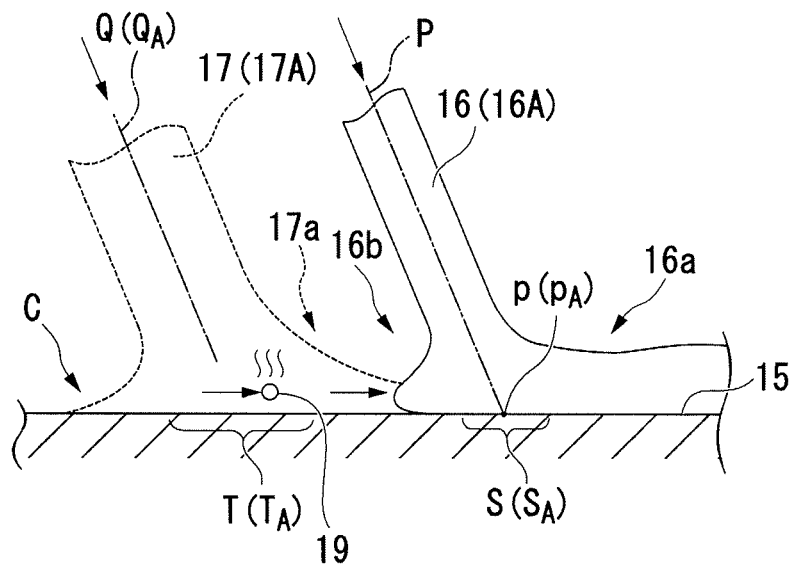
FIG. 4B is a typical view illustrating actions in the cleaning apparatus of the first embodiment of the present invention.

FIG. 3A is an explanatory view, as seen from the front, of the operation of the cleaning apparatus of the first embodiment of the present invention. FIG. 3B is a typical explanatory view showing a state on a surface to be cleaned in the cleaning apparatus of the first embodiment of the present invention. FIGS. 4A and 4B are typical views illustrating actions in the cleaning apparatus of the first embodiment of the present invention.

In order to clean the convex lens surface 15a of the lens 15 using the cleaning apparatus 1, first, the convex lens surface 15a that is a surface to be cleaned is directed to the fixing stand 5 side, and the rotation holding unit 2 is made to hold the lens 15.

Next, in order to form the cleaning region S at a cleaning start position, the elevating stage 6 is lifted to position the cleaning fluid spray unit 7.

The cleaning start position can be set at the surface top of the convex lens surface 15a.

Since the spray current 16 is sprayed along the central axis P of the cleaning fluid spray unit 7, as in the cleaning fluid spray unit 7 shown in FIG. 3A by a two-dot chain line, the fixing stand 5 may be lifted to a height where the extension line of the central axis P intersects the surface top of the lens 15.

However, in the present embodiment, the cleaning start position is set to be slightly above the surface top, in consideration of the variation of the spray current 16 in a radiation direction, or an allowance for the positioning error or the like of the elevating stage 6. That is, the elevating stage 6 is lifted to a height where the extension line of the central axis P intersects a position slightly above the surface top on a circular arc where the convex lens surface 15a and the vertical plane including the optical axis O can intersect each other.

Next, the motor 4 is driven to rotate the driving roller 3a. Thereby, the lens 15 rotates around on the optical axis O aligned with the holding central axes. In the present embodiment, the rotating speed of the lens 15 is set to 120 rpm.

If the rotation of the lens 15 reaches normal rotation, the pump 9 is driven to start the supply of the cleaning fluid L from the supply tube 7b. With the start of the supply of the cleaning fluid L, the regulator 12 is driven to supply the compressed air G into the cleaning fluid spray unit 7 from the supply tube 7c.

Additionally, the regulator 14 is driven to supply the compressed air G into the respective compressed air spray units 8 from the supply tube 8b.

Additionally, the elevating stage 6 is lowered in accordance with the above description.

This starts cleaning.

Cleaning conditions can be appropriately set depending on the degree of contamination of the convex lens surface 15a, or the like.

In the present embodiment, the following cleaning conditions are set as an example. In the cleaning fluid spray unit 7, the flow rate of the cleaning fluid L is set to 0.5 mL/min, and the pressure (gauge pressure) of the compressed air G is set to 0.5 Pa. In the compressed air spray units 8, the pressure (gauge pressure) of the compressed air G is set to 0.5 MPa. The movement speed of the elevating stage 6 is set to 0.2 mm per rotation. The movement speed of the elevating stage 6 is expressed by travel distance per each rotation of the lens 15.

As the elevating stage 6 descends in this way, the cleaning fluid spray unit 7 and the compressed air spray units 8 that are fixed to the fixing stand 5 descend integrally. Therefore, the cleaning region S and the blowing region T move vertically downward. This moves the cleaning position p downward along an intersection line between the vertical plane including the optical axis O and the convex lens surface 15a.

For this reason, the elevating stage 6 is configured by the moving unit 6a, the cleaning region moving unit 6b, and the layered air current moving unit 6c. The moving unit 6a moves the fixing stand 5 that is the holding unit. Additionally, the cleaning region moving unit 6b moves the cleaning fluid spray unit 7 to relatively move the cleaning region S from the rotation center of the lens 15 toward the outer peripheral side of the lens. Additionally, the layered air current moving unit 6c relatively moves the blowing region T, which is an incoming position of the layered air current 17, while following the relative movement of the cleaning region S.

In the cleaning region S, since cleaning proceeds as will be described below, as shown in FIG. 3B, a cleaned region C is formed within a range of a concentric circle centered on the optical axis O, with the movement of the cleaning position p.

Since the whole convex lens surface 15a becomes the cleaned region C if the cleaning position p reaches the outer periphery of the convex lens surface 15a, the cleaning is completed.

If the cleaning is completed, the elevating stage 6 and the motor 4 are stopped after the spraying of the cleaning fluid spray unit 7 and the compressed air spray units 8 are stopped.

Subsequently, when the convex lens surface 15b of the lens 15 or other articles to be cleaned are cleaned, the lens 15 is detached from the rotation holding unit 2, preparation for performing the next cleaning is made, and the above steps are repeated.

The lens 15 can be cleaned in the aforementioned manner.

Next, cleaning actions using the cleaning apparatus 1 will be described.

If the spray current 16 is sprayed from the spray port 7a as shown in FIG. 3A, the spray current 16 is emitted while spreading slightly with the central axis P as a center, and reaches the convex lens surface 15a. Accordingly, a spot-like cleaning region S (refer to FIG. 3B) is formed on the convex lens surface 15a.

The spray current 16 sprayed onto the cleaning region S forms a surface current 16a that spreads along the convex lens surface 15a.

At this time, contaminants 18 (refer to FIG. 4A) such as particulates or impurities, which have adhered on the convex lens surface 15a, are peeled off from the convex lens surface 15a due to the pressure or shock applied to the convex lens surface 15a during the spraying of the spray current 16. The contaminants 18 in the surface current 16a peeled off from the convex lens surface 15a are moved together with the surface current 16a that spreads along the convex lens surface 15a as will be described below, and are removed from the convex lens surface 15a.

Since the central axis P of the cleaning fluid spray unit 7 inclines downward by the angle $\theta_P$ with respect to the horizontal surface, the surface current 16 has a velocity component such that the spray current 16a is directed vertically downward. Therefore, a flow that is directed to the outer peripheral side from the optical axis O and is directed vertically downward along the convex lens surface 15a becomes dominant in cooperation with the action of gravity.

Additionally, the surface current 16a receives the influence of the rotation of the lens 15 as flowing downward along the convex lens surface 15a. Therefore, as shown in FIG. 3B, the course of the surface current 16a is biased toward the rotational direction as a whole.

If the surface current 16a including the contaminants 18 is further directed to the outer peripheral side of the lens 15, the surface current 16a is peeled off due to the curve of the convex lens surface 15a. For this reason, a falling current 16b that is directed downward is formed.

In the present embodiment, the lens 15 is held from below by the driving roller 3a and the holding roller 3b that are spaced apart from each other in the horizontal direction from the optical axis O. Therefore, the falling current 16b moves downward together with the contaminants 18 from an outer edge portion of the convex lens surface 15a between the driving roller 3a and the holding roller 3b.

Around the cleaning region S, as shown in FIG. 4A and FIG. 4B, the scattered matter D is scattered in various directions away from the convex lens surface 15a due to the shock when the spray current 16 is blown onto the convex lens surface 15a. FIG. 4A and FIG. 4B are typical views. Therefore, it is not particularly explicitly shown that the spray current 16 is a two-fluid jet.

The scattered matter D may include, for example, particulates peeled off from the convex lens surface 15a, particulates absorbed by droplets of the cleaning fluid L, airborne droplets in which impurities on the convex lens surface 15a are dissolved in the cleaning fluid L, airborne droplets formed by the droplets of the cleaning fluid L, or the like.

If the scattered matter D attaches to the cleaned region C again, the contaminants 18 (particulates and impurities) included in the scattered matter D attaches again, or moisture included in the cleaning fluid L of the scattered matter D stagnates on the convex lens surface 15a to tarnish glass and contaminate the convex lens surface 15a. As a result, this causes a defect in the lens 15.

In the present embodiment, the layered air current 17 is blown onto a rear position in the movement direction of the cleaning position p. For this reason, the spray current 16 and the cleaning region S are covered with the layered air current 17 as seen from the cleaned region C side.

As a result, for example, as shown in FIG. 4A, if scattered matter $D_0$ is scattered to the cleaned region C side, the scattered matter collides against the layered air current 17, and is returned toward the movement direction of the cleaning position p, for example, like scattered matter $D_1$. Otherwise, like scattered matter $D_2$, the scattered matter is blown against the convex lens surface 15a and moved in the movement direction of the cleaning position p together with the layered air current 17.

For this reason, like scattered matter $D_3$ shown by a two-dot chain line, the scatter matter is not able to pass through the layered air current 17 and move to the cleaned region C side. That is, the layered air current 17 covers the rear side of the spray current 16 to constitute an air curtain that shields the scattered matter D.

Additionally, the layered air current 17 blown against the convex lens surface 15a forms the surface current 17a directed to the movement direction of the cleaning position p, similar to the spray current 16, and the compressed air G that forms the surface current 17a sweeps the top of the convex lens surface 15a to the cleaning region S side. For this reason, there is provided an action to push out the contaminants 18 on the convex lens surface 15a, a droplet 19, and the tip of the spray current 16 blown against the cleaning region S in almost the same direction as the movement direction of the cleaning position p.

This purifies the convex lens surface 15a after the passage of the layered air current 17. Such a push-out action of the layered air current 17 increases as a velocity component in a direction along the convex lens surface 15a increases. For this reason, when the incoming angle $\theta_Q$ of the central axis Q is larger than the incoming angle $\theta_P$ of the central axis P, it is possible to push out the layered air current 17 more efficiently.

Additionally, the flow velocity of the surface current 17 of the layered air current 17 becomes larger in the vicinity of the blowing region T. Accordingly, as the blowing region T is closer to the cleaning region S, the contaminants 18 or the like is efficiently pushed out.

Additionally, as the spacing between the blowing region T and the cleaning region S is narrow, the rate at which the scattered matter D falls between the regions decreases. Therefore, since the scattered matter is pressed against the surface current 16a of the layered air current 17 in a short time even if the scattered matter falls, the readhesion of the scattered matter D can be easily prevented.

Additionally, since the surface current 17a is a flow of the compressed air G that does not include a fluid, as shown in FIG. 4B, drying of the droplet 19 on the surface of the convex lens surface 15a is promoted. For this reason, the droplet 19 that flows to or is scattered to the rear side of the spray current 16 is rapidly dried by the surface current 17a. For this reason, tarnishing of the glass by adhesion of moisture is suppressed.

In this way, the surface current 16a, the scattered matter D (scattered matter from the surface current 16a), and the contaminants 18 adhering to the surface of the convex lens surface 15a, and the droplet 19 move in the movement direction of the cleaning position p so as to be wiped as a whole by the layered air current 17, and are joined to the surface current 16a. For this reason, the contaminants 18 are peeled off from the convex lens surface 15a together with the surface current 16a, fall as the falling current 16b, and are removed from the convex lens surface 15a.

In this way, according to the cleaning apparatus 1, even if the scattered matter D from the convex lens surface 15a of the lens 15 is generated by the spraying of the cleaning fluid L, the periphery of the cleaning region S is covered with the layered air current 17 from the backward side in the movement direction of the cleaning position p, and the scattering of the scattered matter D further toward the backward side than the layered air current 17 is prevented. Therefore, when the cleaning fluid L is sprayed onto the convex lens surface 15a to perform cleaning, the readhesion can be prevented even when the scattered matter D from the convex lens surface 15a is scattered in various directions.

Second Embodiment

Next, a cleaning apparatus of a second embodiment of the present invention will be described.

Figure 5A:
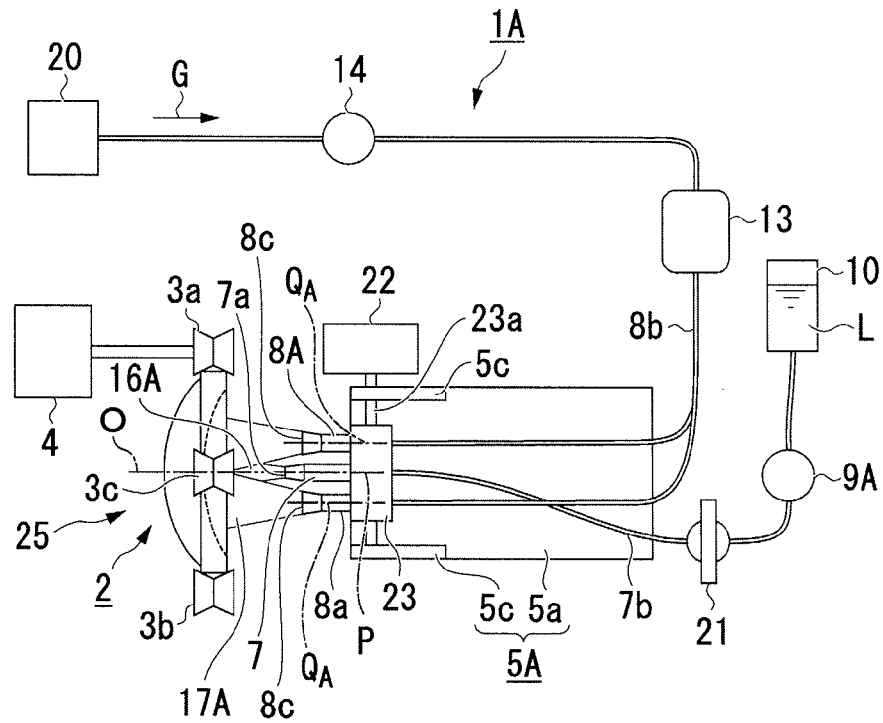
FIG. 5A is a typical plan view showing the schematic configuration of a cleaning apparatus of a second embodiment of the present invention.
Figure 5B:
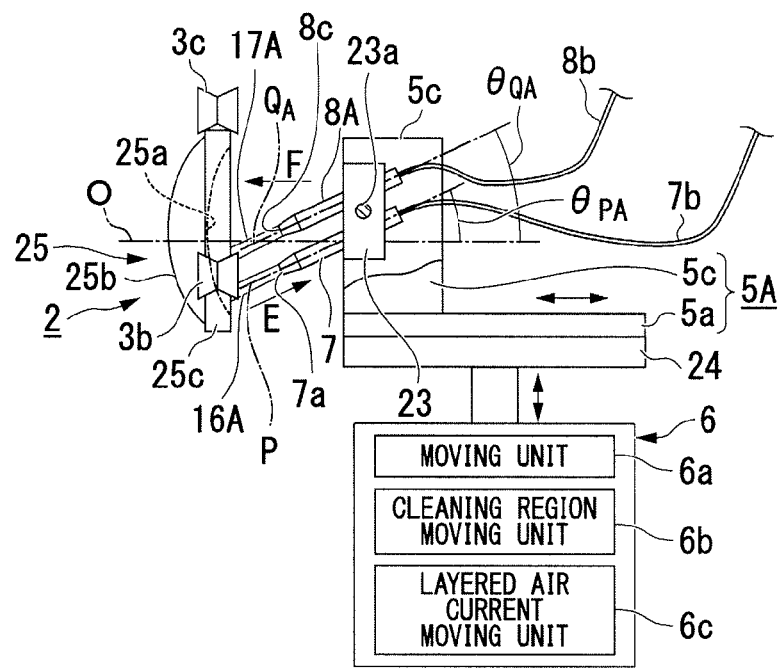
FIG. 5B is a typical front view showing the schematic configuration of the cleaning apparatus of the second embodiment of the present invention.
Figure 6:
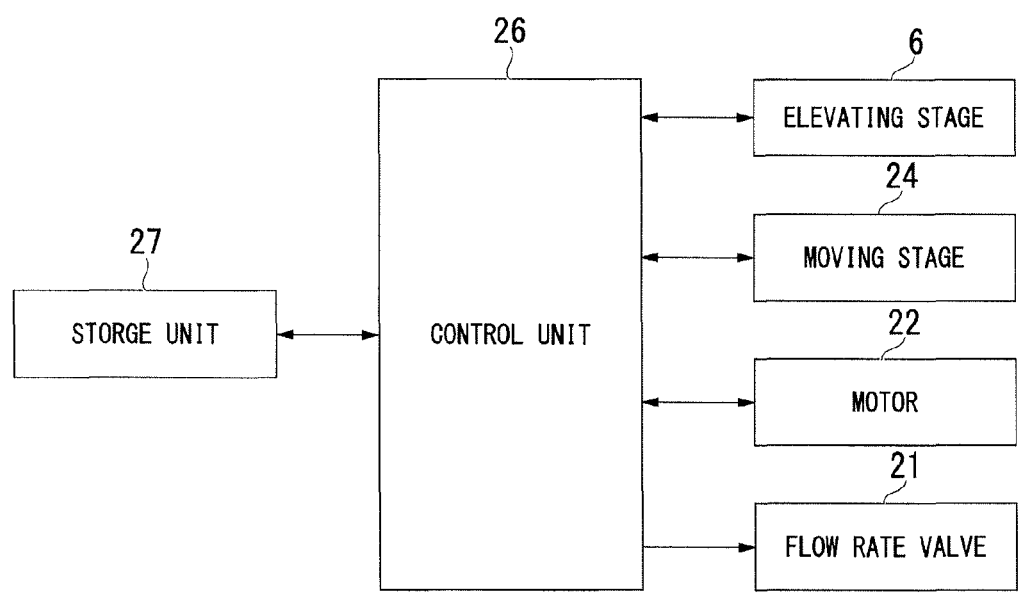
FIG. 6 is a control block diagram of the cleaning apparatus of the second embodiment of the present invention.
Figure 7A:
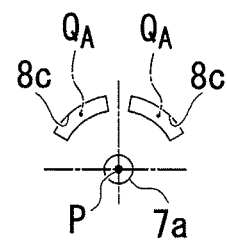
FIG. 7A is a view as seen from E in FIG. 5B.
Figure 7B:
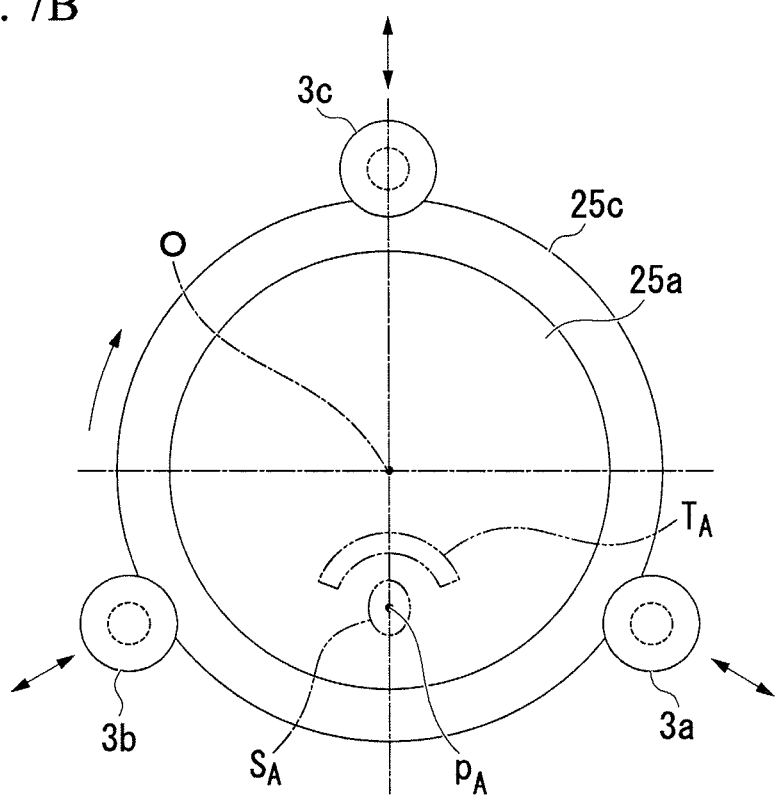
FIG. 7B is a view as seen from F in FIG. 5B.

FIG. 5A is a typical plan view showing the schematic configuration of the cleaning apparatus of the second embodiment of the present invention. FIG. 5B is a typical front view showing the schematic configuration of the cleaning apparatus of the second embodiment of the present invention. FIG. 6 is a control block diagram of the cleaning apparatus of the second embodiment of the present invention. FIG. 7A is a view as seen from E in FIG. 5B. FIG. 7B is a view as seen from F in FIG. 5B.

The cleaning apparatus 1A of the present embodiment, similar to the cleaning apparatus 1, is an apparatus that sprays the cleaning fluid L to an object so as to clean the surface of the object. Although the cleaning method may be the jet cleaning method or may be the two-fluid jet cleaning method, a case where the jet cleaning method is adopted will be described below as an example.

Additionally, the object is not particularly limited if the article has a shape capable of being rotated in a held state and capable of being cleaned by the jet cleaning method.

In the following, as shown in FIGS. 5A and 5B, a case where the object is a glass lens 25 will be described as an example.

The lens 25 is a meniscus lens having a concave lens surface 25a and a convex lens surface 25b, and a lens side surface 25c is formed as a cylindrical surface that is coaxial with the optical axis O.

The surface shape oft the concave lens surface 25a and the convex lens surface 25b may be a spherical surface, or convex surfaces other than the spherical surface, such as an axisymmetrical aspheric surface and an adjustable surface. Additionally, although the surface to be cleaned may be any of the concave lens surface 25a and the convex lens surface 25b, a case where the concave lens surface 25a is the surface to be cleaned will be described below as an example.

The cleaning apparatus 1A is configured by including a fixing stand 5A (tilt holding unit) and a compressed air spray unit 8A (layered air current forming unit) instead of the fixing stand 5 and the compressed air spray unit 8 of the cleaning apparatus 1 of the above first embodiment, and adding a moving stage 24 (a moving unit, a cleaning region moving unit, a layered air current moving unit), and a control unit 26 (refer to FIG. 6, tilt control unit).

Hereinafter, differences from the cleaning apparatus 1 of the above first embodiment will mainly be described.

The fixing stand 5A is a member that fixes and integrally holds the cleaning fluid spray unit 7 and the compressed air spray unit 8A so that the angle of inclination with respect to the holding central axis of the rotation holding unit 2 is variable. The fixing stand 5A includes the base 5a, a pair of supporting plates 5c, a turning block 23 (holding unit), and the motor 22. The pair of supporting plates 5c are erected from end portions of the base 5a so as to face each other. The turning block 23 is held between the pair of supporting plates 5c so as to be turnable around a turning shaft 23a. The motor 22 transmits a rotational driving force to the turning shaft 23a so as to change the turning position of the turning block 23 on the basis of a control signal from the control unit 26.

The turning block 23 is arranged at a position where the turning block faces the concave lens surface 25a that is a surface to be cleaned of the lens 25 held by the rotation holding unit 2.

The supporting plates 5c is arranged to face a direction orthogonal to the optical axis O of the lens 25 within the horizontal surface, and the turning shaft 23a of the turning block 23 also extends in the direction orthogonal to the optical axis O of the lens 25 within the horizontal surface.

The cleaning fluid spray unit 7 and a pair of the compressed air spray units 8A are fixed to the turning block 23.

The cleaning fluid spray unit 7 of the present embodiment is configured by a tubular member having the spray port 7a formed at the tip portion thereof, similar to the cleaning fluid spray unit 7 of the above first embodiment. However, the present embodiment is different from the above first embodiment in that only the cleaning fluid L is sprayed as a spray current 16A onto the surface to be cleaned of the lens 25 held by the rotation holding unit 2.

For this reason, the supply tube 7c, the filter 11, and the regulator 12 in the above first embodiment are eliminated in the present embodiment.

Additionally, the present embodiment include a high-pressure pump 9A instead of the pump 9 of the above first embodiment so that spraying of a pressure required for cleaning can be performed using only the pressure of the cleaning fluid L only.

Moreover, a flow rate valve 21 for adjusting the flow rate of the cleaning fluid L sprayed from the spray port 7a during cleaning is added on the supply tube 7b between the cleaning fluid spray unit 7 and the high-pressure pump 9A.

As shown in FIG. 6, the flow rate valve 21 is electrically connected to the control unit 26, and is able to adjust the flow rate on the basis of a control signal sent out from the control unit 26.

Additionally, as shown in FIG. 5B, when the turning position of the turning block 23 is fixed at a turning position (hereinafter referred to as a turning reference position) that becomes a reference, the cleaning fluid spray unit 7 of the present embodiment is fixed to the turning block 23 in a posture where, within the vertical plane including the optical axis O, the spray port 7a is directed downward and the central axis P of the cleaning fluid spray units 7 are inclined by an angle $\theta_{PA}$ with respect to the optical axis O.

However, if the turning block 23 is rotated by an angle $\phi$ by the motor 22, the angle $\theta$ of the central axis P with respect to the optical axis O is changed to $\theta=\theta_{PA}+\phi$.

In the present embodiment, the angle $\theta$ is controlled by the control unit 26 so that the incoming angle of the central axis P with respect to the concave lens surface 25a becomes constant.

The incoming angle of the central axis P is preferably set to a constant value within a range of 1° to 60°. In the present embodiment, the incoming angle of the central axis P is set to 30° as an example.

In the present embodiment, since the setting when the central axis P enters the surface top of the concave lens surface 25a is made at the turning reference position of the turning block 23, $\theta_{PA}=30(°)$ is established.

The emission range of the spray current 16A varies depending on conditions, such as the nozzle shape of the spray port 7a or the flow rate of the cleaning fluid L. In the present embodiment, by forming the nozzle shape of the spray port 7a cylindrical, the cleaning fluid L is sprayed in a beam shape having a substantially uniform cross-section even if the flow rate thereof changes.

For this reason, as shown in FIG. 7B, a spray current is blown in the shape of a smaller spot compared to the size of the convex lens surface 15a (a two-dot chain line shown by symbol $S_A$) on the concave lens surface 25a.

Since the region $S_A$ against which the spray current 16A is blown is a region where surface cleaning proceeds efficiently due to the pressure or shock produced by blowing the spray current 16 is hereinafter referred to as a cleaning region $S_A$.

In the present embodiment, the shape of the spray port 7a is a circular shape with a diameter of 2 mm. Additionally, the cleaning region $S_A$ at a position where the spray current 16A is blown on the surface top of the concave lens surface 25a becomes larger than a circular shape with a diameter of 2 mm, and is formed in a substantially elliptical vertically-long region.

In the following, when the position of the cleaning region $S_A$ on the concave lens surface 25a is expressed, an intersection point between the central axis P and the concave lens surface 25a is used. This intersection point is referred to as a cleaning position $p_A$. The cleaning position $p_A$ substantially coincides with the center of the cleaning region $S_A$.

From such a configuration, the fixing stand 5A constitutes the tilt holding unit that tiltably holds the cleaning fluid spray unit 7.

Additionally, the control unit 26 constitutes the tilt control unit that controls the tilt amount of the tilt holding unit so that the angle of the central axis P of the spray port 7a of the cleaning fluid spray unit 7 with respect to a normal line N of the concave lens surface 25a at the cleaning position $p_A$ becomes a constant angle.

The compressed air spray unit 8A is a member that forms a layered air current 17A that enters the concave lens surface 25a so as to cover the periphery of the cleaning region $S_A$ from above.

In the present embodiment, the compressed air spray unit 8A is configured by a pair of tubular members at tip portions of which spray ports 8c having a circular-arc slit-shaped opening through which the compressed air G is sprayed in layers are formed.

As shown in view 5B, when being fixed to the turning reference position of the turning block 23, both the compressed air spray units 8A are fixed to the turning block 23 in a posture where, within the vertical plane including the optical axis O, the spray ports 8c are directed downward, and a central axis $Q_A$ of the compressed air spray units 8A are inclined by an angle $\theta_{QA}$ with respect to the optical axis O.

The angle $\theta_{QA}$ is set to a size equal to or more than the angle $\theta_P$. In the present embodiment, as an example, the incoming angle is set to $\theta_Q=35(°)$.

In addition, in the present embodiment, the angle $\theta_{QA}$ is the incoming angle of the central axis $Q_A$ with respect to the concave lens surface 25a, similar to the angle $\theta_{PA}$.

If $\theta_{PA}<\theta_{QA}$ is established in this way, the spacing between the cleaning region $S_A$ and the blowing region $T_A$ is easily secured so that the cleaning fluid spray unit 7 and the compressed air spray unit 8A do not interfere with each other even if the spacing is narrowed. Therefore, the layout of the apparatus is simplified.

Additionally, since the spacing can be secured so that the cleaning fluid spray unit 7 and the compressed air spray unit 8A do not interfere with each other even if the distance from the concave lens surface 25a to the spray ports 7a and 8a is made small, drop in the spraying pressure of the spray current 16A and the layered air current 17A can be prevented. Additionally, further miniaturization of the apparatus can be achieved.

Additionally, as shown in FIG. 7A, the pair of compressed air spray units 8A are arranged so that the respective spray ports 8c are aligned on one concentrical circle with respect to the central axis P as a whole above the right and left of the spray port 7a of the cleaning fluid spray unit 7, and upper portions of the pair of compressed air spray units 8A are slightly spaced apart from each other in the horizontal direction.

Additionally, the respective spray ports 8c are arranged at plane-symmetrical positions with the vertical plane including the central axis P as a plane of symmetry.

Here, spacing the respective spray ports 8c apart from each other in the horizontal direction at the upper portions thereof is an arrangement made in consideration of the fact that the layered air currents 17A sprayed from the spray ports 8c spread in the circumferential direction of the openings of the spray ports 8c.

The respective layered air currents 17A spread in the circumferential direction of the spray ports 8c after being sprayed from the spray ports 8c, whereby the respective layered air currents 17A approach each other as getting close to the concave lens surface 25a, and the circular-arc layered air currents 17A whose upper portions are closed are formed.

The layered air current 17A connected in a circular-arc shape enters the concave lens surface 25a, and as shown in view 7B, is blown against a circular-arc region of the concave lens surface 25a. In the following, a region against which this layered air current 17A is blown is referred to as a blowing region $T_A$.

As shown in FIG. 5A, similar to the above first embodiment, the supply tube 8b, the filter 13, and the regulator 14 are connected to base end portions of the respective compressed air spray units 8.

As shown in FIG. 5B, the moving stage 24 is a member that is provided between the elevating stage 6 and the base 5a to advance and retract the fixing stand 5A in a direction along the optical axis O toward the lens 25 held by the rotation holding unit 2.

Additionally, as shown in FIG. 6, the moving stage 24 is electrically connected to the control unit 26, and is able to adjust the travel distance on the basis of a control signal sent out from the control unit 26.

As the configuration of the moving stage 24, for example, a single-axis stage using a motor and a feed-screw mechanism, a linear motor, or the like can be adopted.

The control unit 26 is a member that controls the cleaning operation of the cleaning apparatus 1A. As shown in FIG. 6, the control unit 26 is electrically connected to so as to be able to perform communication with the elevating stage 6, the moving stage 24, the motor 22, and the flow rate valve 21.

Additionally, the control unit 26 is electrically connected to a storage unit 27 that stores information on the shape of the surface to be cleaned of the lens 25 and information on the positional relationship between the rotation holding unit 2 and the fixing stand 5A.

The control performed by the control unit 26 is aimed at keeping the cleaning power in the cleaning region $S_A$ substantially constant when the cleaning position $p_A$ moves. For example, the control of changing the angles of the cleaning fluid spray unit 7 and the compressed air spray units 8A with respect to the optical axis, on the basis of a shape change in the concave lens surface 25a with respect to the spray current 16A accompanying the movement of the cleaning position $p_A$ can be included. Additionally, the control of keeping the distance from the spray port 7a of the cleaning fluid spray unit 7 to the cleaning position $p_A$ constant may be included.

In the present embodiment, a device configuration of the control unit 26 adopts a computer including a CPU, a memory, an input/output interface, an external storage, or the like.

Next, the operation of the cleaning apparatus 1A will be described with a central focus on a cleaning method using the cleaning apparatus 1A.

Figure 8:
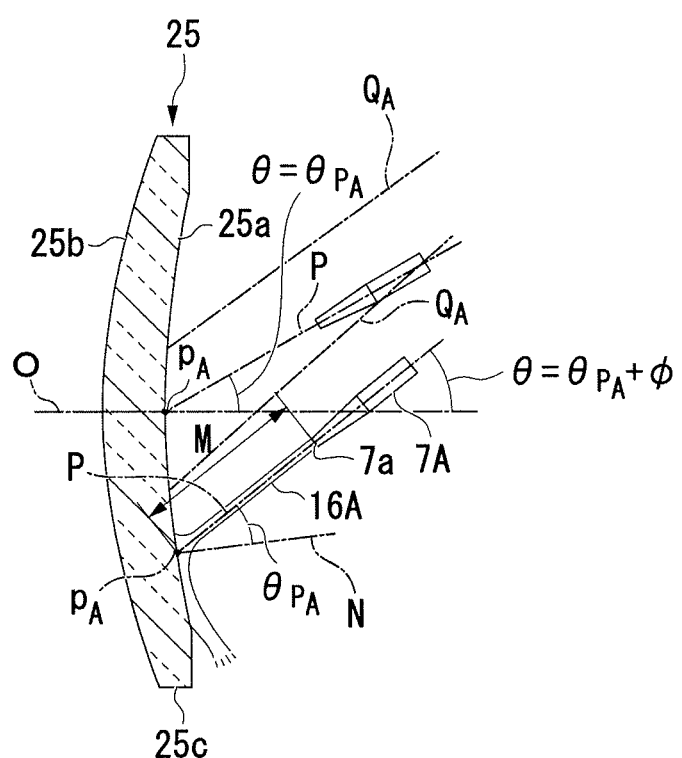
FIG. 8 is an explanatory view, as seen from the front, of the operation of the cleaning apparatus of the second embodiment of the present invention.

FIG. 8 is an explanatory view, as seen from the front, of the operation of the cleaning apparatus of the second embodiment of the present invention.

In the cleaning operation of the present embodiment, the relative positional relationship between the concave lens surface 25a of the lens 25 held by the rotation holding unit 2 and the cleaning fluid spray unit 7 is controlled by the control unit 26 during cleaning. As shown in FIG. 8, the present embodiment is different from the above first embodiment in that the cleaning operation is performed in a state where the incoming angle of the central axis P with respect to a normal line at each cleaning position $p_A$ is set to a constant angle $\theta_{PA}$ and the distance between the cleaning position $p_A$ and the spray port 7a is set to a constant value, such as, for example, M.

For this reason, before the cleaning is started, the control unit 26 calculates the locus of the cleaning position $p_A$ on the basis of shape information on the concave lens surface 25a stored in advance in the storage unit 27. The displacement in the direction of the optical axis O and the change of the normal line of the cleaning position $p_A$ on this locus are calculated, the incoming angle of the central axis P for every cleaning position $p_A$ is set to the constant angle $\theta_{PA}$, and a control target value corresponding to the position of the fixing stand 5A and the turning position of the turning block 23 used to set the distance to the spray port 7a to the distance M is found.

This control target value can be commonly used if the shape of the object is constant. For this reason, in the present embodiment, control target values based on the shapes of a plurality of articles to be cleaned is calculated in advance. For example, the control target values are stored in the form of tables and functions in the storage unit 27.

Accordingly, the control unit 26 is able to selectively read a control target value according to a surface to be cleaned from the storage unit 27 before cleaning starts.

In order to clean the concave lens surface 25a of the lens 25 using the cleaning apparatus 1A, first, the concave lens surface 25a that is a surface to be cleaned is directed to the fixing stand 5A side, and the rotation holding unit 2 is made to hold the lens 25.

Next, the control unit 26 reads a control target value corresponding to the concave lens surface 25a of the lens 25 from the storage unit 27.

On the basis of the control target value for forming the cleaning region $S_A$ at the cleaning start position, the control unit 26 drives the elevating stage 6 and the moving stage 24 to perform the parallel movement of the fixing stand 5A, and drives the motor 22 to perform the turning of the turning block 23. Accordingly, setting of a relative position is performed so that the extension line of the central axis P of the cleaning fluid spray unit 7 intersects the cleaning start position on the concave lens surface 25a, the incoming angle of the central axis P becomes the angle $\theta_{PA}$, and the distance from the cleaning start position to the spray port 7a becomes the distance M.

The cleaning start position of the present embodiment is set so as to be slightly above the surface top of the concave lens surface 25a, similar to the above first embodiment.

Next, the lens 25 is rotated similar to the above first embodiment.

If the rotation of the lens 25 reaches normal rotation, the pump 9 is driven to start the supply of the cleaning fluid L from the supply tube 7b. At this time, the control unit 26 controls the flow rate valve 21 so that a preset constant flow is obtained.

In addition, by generating steam in the cleaning fluid supply unit 10, the cleaning fluid L can also be supplied with steam pressure even if there is no pump 9. Accordingly, consumption of the cleaning fluid L can be reduced, and an antifouling effect caused by heat can also be obtained.

Additionally, similar to the above first embodiment, the regulator 14 is driven to supply the compressed air G into the respective compressed air spray units 8A from the supply tube 8b.

Additionally, the control unit 26 lowers the elevating stage 6 in accordance with these, and relatively moves the cleaning position $p_A$ vertically downward from the cleaning start position.

At this time, since the control unit 26 drives the elevating stage 6, the moving stage 24, and the motor 22 on the basis of the control target value read from the storage unit 27, the incoming angle of the central axis P and the distance from the cleaning position $p_A$ to the spray port 7a are kept at constant values $\theta_{PA}$ and M, respectively, even if the cleaning position $p_A$ moves.

Cleaning conditions can be appropriately set depending on the degree of contamination of the concave lens surface 25a, or the like.

In the present embodiment, the following cleaning conditions are set as an example. In the cleaning fluid spray unit 7, the flow rate of the cleaning fluid L is set to 240 mL/min. In the compressed air spray units 8A, the pressure (gauge pressure) of the compressed air G is set to 0.5 MPa. The movement speed of the elevating stage 6 is set to 0.2 mm per rotation, similar to the above first embodiment.

Additionally, similar to the first embodiment, a combination may be adopted, in which two kinds of the water-based cleaning fluid and the pure water, are used and cleaning is performed with the pure water after cleaning is performed with the water-based cleaning fluid.

In this way, as shown in FIGS. 4A and 4B, cleaning proceeds substantially similar to the above first embodiment with the movement of the cleaning position $p_A$ in the cleaning region $S_A$ and its periphery.

For example, if the spray current 16A and the layered air current 17A reach the concave lens surface 25a, the surface currents 16a and 17a are formed, respectively. The surface currents 16a and 17a form flows mainly directed to the movement direction of the cleaning position $p_A$.

Additionally, since the spray current 16A and the surface current 16a of the present embodiment are formed by the cleaning fluid L only, the scattered matter D formed by particulates only decreases. In this case, the description of the above first embodiment regarding the scattered matter D is similarly applicable to the present embodiment.

Hereinafter, differences from the above first embodiment will mainly be described.

In the present embodiment, since the cleaning region $S_A$ is formed at a position with the distance M from the spray port 7a, the flow rate of the spray current 16A is constant, and the incoming angle of the central axis P is constant, the pressure or shock caused by the spray current 16A that advances along the central axis P becomes constant irrespective of the position of the cleaning position $p_A$. For this reason, the cleaning power in every place can be kept constant irrespective of the shape or position of the concave lens surface 25a, and uneven cleaning can be suppressed.

Additionally, since the incoming angle of the central axis P is constant, the distribution of the scattered matter D from the spray current 16A in a scattering direction becomes substantially constant irrespective of the position of the cleaning position $p_A$.

Moreover, since each compressed air spray unit 8A is fixed to the turning block together with the cleaning fluid spray unit 7, the incoming angle of the central axis $Q_A$ is also kept constant similar to the incoming angle of the central axis P, and the relative positional relationship between the spray current 16A and the layered air current 17A becomes constant irrespective of the position of the cleaning position $p_A$.

For this reason, even if the range where the layered air current 17A covers the spray current 16A is set to be narrower compared to the above first embodiment, the scattered matter D can be prevented as well as the above first embodiment.

For this reason, the present invention is particularly suitable for cleaning in a case where the object is a lens with a small curvature radius.

Additionally, in the present embodiment, the layered air current 17A is formed in the shape of a concentric circular arc centered on the central axis P. A substantially uniform air curtain is formed at the periphery of the cleaning region $S_A$ by the layered air current 17A. For this reason, since the spacing between the cleaning region $S_A$ where the scattered matter D may be scattered and the blowing region $T_A$ becomes substantially uniform, it is possible to further suppress uneven cleaning.

Additionally, since the layered air current 17A curves in a circular-arc shape, particularly when the surface to be cleaned is a concavo-convex surface resembling a spherical surface, the variation in the incoming angle of the layered air current 17A with respect the surface to be cleaned becomes smaller compared to planar layered air currents. For this reason, the stability of the surface current 17a of the layered air current 17A at the periphery of cleaning region $S_A$ can be improved, the action of pushing out the end portion of the spray current 16A and the scattered matter D to the movement direction side can be further stabilized, and more efficient push-out can be performed.

In this way, according to the cleaning apparatus 1A, even if the scattered matter D from the concave lens surface 25a of the lens 25 is generated by the spraying of the cleaning fluid L, the periphery of the cleaning region $S_A$ is covered with the layered air current 17A from the backward side in the movement direction of the cleaning position $p_A$, and the scattering of the scattered matter D further toward the backward side than the layered air current 17A is prevented. Therefore, when the cleaning fluid L is sprayed onto the concave lens surface 25a to perform cleaning, the readhesion can be prevented even when the scattered matter D from the concave lens surface 25a is scattered in various directions.

In the description of the above respective embodiments, a case where the cleaning fluid spray unit and the layered air current forming unit are integrally provided at the holding unit and the holding unit is moved with respect to the rotation holding unit has been described as an example. However, as long as the holding unit and the rotation holding unit can relatively move the cleaning region from the rotation center toward the outer peripheral side, either or both of the holding unit and the rotation holding unit may move.

Additionally, in the description of the above respective embodiments, a case where the cleaning fluid spray unit and the layered air current forming unit are integrally provided at the holding unit and the holding unit is moved with respect to the rotation holding unit has been described as an example. However, a configuration may be adopted, separately including the cleaning region moving unit that moves at least one of the rotation holding unit and the cleaning fluid spray unit to relatively move the cleaning region from the rotation center of the object toward the outer peripheral side and the layered air current moving unit that relatively move the incoming position of the layered air current while following the relative movement of the cleaning region.

Additionally, in the description of the above second embodiment, a case where the cleaning fluid spray unit 7 and the compressed air spray units 8A are integrally provided at the turning block 23 that is the holding unit has been described as an example. However, the compressed air spray units 8A may be configured so as to be able to tilt independently from the cleaning fluid spray unit 7.

In this case, since the tilt amount of the cleaning fluid spray unit 7 and the tilt amount of the compressed air spray unit 8A can be independently controlled, respectively, the relative tilt amounts may be made to coincide with each other similar to the above second embodiment, and the tilt amount of the cleaning fluid spray unit 7 and the compressed air spray unit 8A may be made to be different from each other.

For example, the control of increasing the incoming angle of the central axis $Q_A$ as the blowing region $T_A$ goes to the outer peripheral side, thereby further strengthening the push-out action of the layered air current 17A toward the outer peripheral side, is possible.

Additionally, in the description of the above respective embodiments, a case where the layered air current 17 with an inverted V-shaped cross-section is formed by the pair of compressed air spray units 8 and the layered air current 17A with a circular-arc cross-section is formed by the pair of compressed air spray units 8A has been described as an example. However, a configuration, including a layered air current forming unit including one spray port that forms a slit whose opening shape corresponding to the cross-sectional shape of the layered air current 17 is inverted V-shaped, may be adopted. A configuration, including a layered air current forming unit including one spray port that forms a slit whose opening shape corresponding to the cross-sectional shape of the layered air current 17A is circular-arc, may be adopted.

Additionally, in the description of the above respective embodiments, a case where the holding central axis of the rotation holding unit 2 is arranged in the horizontal direction has bee described. However, the direction of the holding central axe is not particularly limited in a case where the backflow of the cleaning fluid L to the cleaned region C can be prevented by the balance between the action, gravity, and centrifugal force of the spray current 16 (16A) and the layered air current 17 (17A) when the cleaning region is moved from the rotation center toward the outer peripheral side. For example, it is also possible to align the holding central axis with the vertical axis.

Additionally, in the description of the above second embodiment, a case where the control of setting the incoming angle of the central axis P to the constant angle $\theta_{PA}$ for every cleaning position $p_A$ and setting the distance to the spray port 7a to the distance M has been described. However, the control of keeping the pressure or shock on the concave lens surface 25a constant is not limited to this.

For example, a configuration in which the moving stage 24 is eliminated and the flow rate of the spray current 16A is adjusted for every cleaning position $p_A$ by the flow rate valve 21 may be adopted. That is, since the distance between the spray port 7a and the concave lens surface 25a becomes short on the outer peripheral side of the concave lens surface 25a, the pressure or shock on the concave lens surface 25a can be kept constant by reducing the flow rate. When the surface to be cleaned is a convex surface, conversely, the flow rate may be increased with closer toward the outer peripheral side.

Additionally, in the description of the above second embodiment, a case where the pressure or shock on the concave lens surface 25a is kept constant by performing the control of setting the incoming angle of the central axis P to the constant angle $\theta_{PA}$ for every cleaning position $p_A$ and setting the distance to the spray port 7a to the distance M has been described. However, when the magnitude of the pressure or shock and cleaning power do not correspond to each other depending on the property of dirt, a configuration in which the pressure or shock changes may be adopted.

Additionally, even if the pressure or shock of the spray current 16A changes to some extent, the pressure or shock may be changed even when substantially the same cleaning power is obtained in an allowable range.

That is, the distance M or the flow rate may not be continuously changed in one-to-one correspondence to changes in the shape of the surface to be cleaned, but may be gradually changed. For example, the control of switching the setting value of the distance M or flow rate on the inner peripheral side and the outer peripheral side with ⅔ of a lens radius as a border may be performed.

Additionally, in the above description, a case where the spraying pressure of the compressed air spray unit 8A (layered air current forming unit) is constant has been described as an example. However, the spraying pressure of the layered air current forming unit may be changed along the movement direction.

Additionally, in the above description, a case where the layered air current forming unit is the compressed air spray unit 8 or 8A that forms the layered air current 17 or 17A by the compressed air G has been described as an example. However, the layered air current may be formed by air currents other than air, for example, air currents, such as Ar gas or nitrogen gas.

Additionally, all the constituent elements described in the above respective embodiments may be carried out by appropriate combination or elimination in the scope of the technical idea of the present invention.

The invention claimed is:

1. A cleaning apparatus comprising:
a rotary support jig for supporting the radial edge of an object to be cleaned, and for rotating the object in a plane having a center of rotation, the rotary support jig being configured to orient the object to be cleaned in a vertical fashion and having a at least one drive roller and at least one holding roller arranged along a circle corresponding to a radial edge of the object to be cleaned, at least one of the holding and driving rollers being configured to retract;
a motor for causing the jig to rotate the object in the plane and around the center of rotation while the object is supported by the jig;
a cleaning fluid nozzle for spraying a cleaning fluid along a first central axis which intersects with the plane, the cleaning fluid nozzle being configured for spot like cleaning of a region on the object to be cleaned;

means for causing relative movement between the jig and the cleaning fluid nozzle while cleaning fluid is sprayed by the cleaning fluid nozzle such that a point at which the first central axis intersects the plane moves along a radial path relative the center of rotation;

a gas nozzle for spraying a layer of gas along a second central axis; and means for moving the gas nozzle in concert with the cleaning fluid nozzle as the cleaning fluid nozzle moves along the radial path with the second central axis of the gas nozzle following the first central axis of the cleaning fluid nozzle relative to the direction of movement along the path.

2. The cleaning apparatus according to claim 1, further including means for adjusting the angular orientation of the cleaning fluid nozzle so as to adjust the orientation of the first central axis relative to the plane.

3. The cleaning apparatus according to claim 2, further including a memory for storing information about the profile of the object to be cleaned and wherein the adjusting means adjusts the angular orientation of the cleaning fluid nozzle as a function of the stored information.

4. The cleaning apparatus according to claim 3, wherein the adjusting means adjusts the angular orientation of the cleaning fluid nozzle as a function of the relative movement of the jig and the cleaning fluid nozzle.

5. The cleaning apparatus according to claim 2, wherein the adjusting means also adjusts the angular orientation of the gas nozzle so as to adjust the orientation of the second central axis relative to the plane.

6. The cleaning apparatus according to claim 4, further including a memory for storing information about the profile of the object to be cleaned and wherein the adjusting means adjusts the angular orientation of the cleaning fluid nozzle and the gas nozzle as a function of the stored information.

7. The cleaning apparatus according to claim 6, wherein the adjusting means adjusts the angular orientation of the cleaning fluid nozzle and the gas nozzle as a function of the relative movement of the jig, the cleaning fluid nozzle and the gas nozzle.

8. The cleaning apparatus according to claim 1, wherein the means for causing relative movement between the jig and the cleaning fluid nozzle includes a platform which supports the cleaning fluid nozzle and a motor which moves the platform in a direction parallel to the plane.

9. The cleaning apparatus according to claim 8, wherein the platform also supports the gas nozzle and the gas nozzle moves in a direction parallel to the plane along with the cleaning fluid nozzle.

10. The cleaning apparatus according to claim 1, wherein the first and second central axes are inclined relative to the plane.

11. The cleaning apparatus according to claim 10, where the inclination of the first and second central axes is opposite to the direction of movement of the cleaning fluid nozzle and the gas nozzle relative along the radial path.

12. The cleaning apparatus according to claim 10, where the inclination of the first central axes is opposite to the direction of movement of the cleaning fluid nozzle along the radial path.

13. The cleaning apparatus according to claim 10, where the inclination of the second central axes is opposite to the direction of movement of the gas nozzle relative along the radial path.

14. The cleaning apparatus according to claim 1, further including means for adjusting the distance of the cleaning fluid nozzle from the plane as the cleaning fluid nozzle moves along the radial path.

15. The cleaning apparatus according to claim 1, further including means for adjusting the distance of the gas nozzle from the plane as the gas nozzle moves along the radial path.

* * * * *